(12) United States Patent
Chen et al.

(10) Patent No.: US 8,946,078 B2
(45) Date of Patent: Feb. 3, 2015

(54) METHOD OF FORMING TRENCH IN SEMICONDUCTOR SUBSTRATE

(75) Inventors: Tong-Yu Chen, Hsinchu (TW); Chih-Jung Wang, Hsinchu (TW)

(73) Assignee: United Microelectronics Corp., Science-Based Industrial Park, Hsin-Chu (TW)

(*) Notice: Subject to any disclaimer, the term of this patent is extended or adjusted under 35 U.S.C. 154(b) by 197 days.

(21) Appl. No.: 13/426,624

(22) Filed: Mar. 22, 2012

(65) Prior Publication Data
US 2013/0252431 A1 Sep. 26, 2013

(51) Int. Cl.
*H01L 21/4763* (2006.01)

(52) U.S. Cl.
USPC .... 438/638; 438/637; 438/942; 257/E21.023; 257/E21.546

(58) Field of Classification Search
CPC ............ H01L 21/311; H01L 21/0337; H01L 21/0338; H01L 21/3086; H01L 21/3088; H01L 21/31144; H01L 21/31116; H01L 21/31138
USPC ................ 438/637, 942, 638; 257/E21.546, 257/E21.023
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,531,437 B2 | 5/2009 | Brask | |
| 7,569,857 B2 | 8/2009 | Simon | |
| 7,618,865 B2 * | 11/2009 | Johansson et al. | 438/269 |
| 7,666,578 B2 | 2/2010 | Fischer | |
| 2004/0043623 A1 | 3/2004 | Liu | |
| 2004/0195624 A1 | 10/2004 | Liu | |
| 2004/0259349 A1 * | 12/2004 | Shimizu | 438/638 |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0108528 A1 | 5/2007 | Anderson | |
| 2007/0158756 A1 | 7/2007 | Dreeskornfeld | |
| 2008/0157208 A1 | 7/2008 | Fischer | |
| 2009/0101995 A1 | 4/2009 | Beintner | |
| 2009/0124097 A1 | 5/2009 | Cheng | |
| 2009/0242964 A1 | 10/2009 | Akil | |
| 2009/0269916 A1 | 10/2009 | Kang | |
| 2010/0048027 A1 | 2/2010 | Cheng | |
| 2010/0072553 A1 | 3/2010 | Xu | |
| 2010/0144121 A1 | 6/2010 | Chang | |
| 2010/0167506 A1 | 7/2010 | Lin | |

* cited by examiner

*Primary Examiner* — Michelle Mandala
(74) *Attorney, Agent, or Firm* — Winston Hsu; Scott Margo (57) ABSTRACT

The present invention provides a method of forming a trench in a semiconductor substrate. First, a first patterned mask layer is formed on a semiconductor substrate. The first patterned mask layer has a first trench. Then, a material layer is formed along the first trench. Then, a second patterned mask layer is formed on the material layer to completely fill the first trench. A part of the material layer is removed when the portion of the material layer between the second patterned mask layer and the semiconductor substrate is maintained so as to form a second trench. Lastly, an etching process is performed by using the first patterned mask layer and the second patterned mask layer as a mask.

12 Claims, 10 Drawing Sheets

METHOD OF FORMING TRENCH IN SEMICONDUCTOR SUBSTRATE

BACKGROUND OF THE INVENTION

1. Field of the Invention

The present invention relates to a method of forming a trench in a semiconductor substrate, and more particularly, to a method of forming an ultra-narrow trench in a semiconductor substrate.

2. Description of the Prior Art

In semiconductor manufacturing processes, in order to transfer an integrated circuit layout onto a semiconductor wafer, the integrated circuit layout is first designed and formed as a photo-mask pattern. The photo-mask pattern is then proportionally transferred to a photoresist layer positioned on the semiconductor wafer. This is so called lithography technology.

As the continuous improvement, the current lithography techniques no longer meet the requirements for the reduced dimension of the product devices. For example, in a conventional damascene process for forming a metal interconnection system, a trench pattern is first formed in a hard mask layer, following by a dry etching process to transfer the trench pattern into a dielectric layer by using the hard mask layer as a mask. A metal layer is subsequently filled into the trench in the dielectric layer to form a metal conductive line. However, the width of the trench can not be further reduced due to the limitation of the lithography technology, and the whole dimension of the metal interconnection system and the integration circuit can not be reduced as well.

Therefore, there is still a need for a novel method of forming an ultra-narrow trench in a semiconductor substrate.

SUMMARY OF THE INVENTION

The present invention therefore provides a method of forming a trench in a semiconductor substrate.

According to one embodiment of the present invention, a method of forming a trench in a semiconductor substrate is provided. First, a first patterned mask layer is formed on a semiconductor substrate. The first patterned mask layer has a first trench. A material layer is formed conformally along the first trench. Then, a second patterned mask layer is formed on the material layer to completely fill the first trench. A part of the material layer is removed when the portion of the material layer between the second patterned mask layer and the semiconductor substrate is maintained so as to form a second trench. Finally, an etching process is performed by using the first patterned mask layer and the second patterned mask layer as a mask.

According to another embodiment of the present invention, a method of forming a trench in a semiconductor substrate is provided. First, a first patterned mask layer is formed on a semiconductor substrate. The first patterned mask layer has a first trench. A material layer is formed conformally along the first trench. A portion of the material layer is removed, while only a portion of the material layer on the sidewall of the trench is maintained. Then, a second patterned mask layer is formed to completely fill the first trench. The material layer is completely removed to form a second trench. Finally, an etching process is performed by using the first patterned mask layer and the second patterned mask layer as a mask.

The method set forth by the present invention is to conformally form the material layer along the first trench, and then use the second mask layer to completely fill the first trench. The material layer on the sidewall of the first trench is then removed to form a second trench having a width substantially equal to the thickness of the material layer. By using the method provided by the present invention, an ultra-narrow trench can be obtained in the semiconductor substrate.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
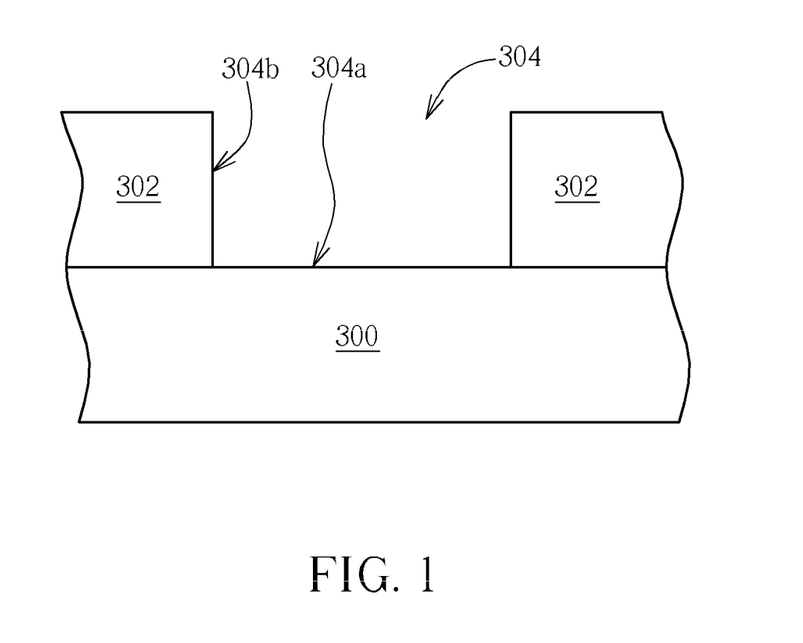
FIG. 1 to FIG. 7 are schematic diagrams of the method of forming a trench in a semiconductor substrate according to the first embodiment of the present invention.

Please refer to FIG. 1 to FIG. 7, which are schematic diagrams of the method of forming a trench in a semiconductor substrate according to the first embodiment of the present invention. As shown in FIG. 1, a substrate 300 is provided. The substrate 300 can include a semiconductor substrate, such as a silicon substrate, an epitaxial silicon substrate, a silicon germanium substrate, a silicon carbide substrate or a silicon-on-insulator (SOI) substrate. In another embodiment, the substrate 300 may include a non-semiconductor substrate, such as a glass substrate for a thin-film-transistor display device formed thereon, or a fused quartz for a photo mask formed thereon. In one embodiment, the substrate 300 may include one or a plurality of low-k dielectric layers (not shown) for metal interconnection system such as dual damascene structure formed therein. For example, the substrate 300 can include a plurality of doped regions, one or a plurality of low-k dielectric layers or a metal interconnect system, in which one or a plurality of microelectronic components are disposed, such as a complementary metal oxide semiconductor (CMOS) or a photo-diode. Then, a first patterned mask layer 302 is formed on the substrate 300. In one embodiment, the first patterned mask layer has a first trench 304 with a bottom surface 304a and sidewalls 304b. The bottom surface 304a of the first trench 304 exposes the substrate 300. The first patterned mask layer 302 may be of any materials suitable for being a hard mask, such as silicon nitride (SiN), silicon oxynitride (SiON), silicon carbide (SiC) or advanced pattern film (APF) provided by Applied Material. In another embodiment, the first patterned mask layer 304 may be a multi-layered structure having a phosphor-silicate glass (PSG) layer and a SiN layer disposed thereon. In another embodiment, the first patterned mask layer 302 may include organic polymer, such as spin-on-glass (SOG) or SiLK™ polymer.

Figure 2:
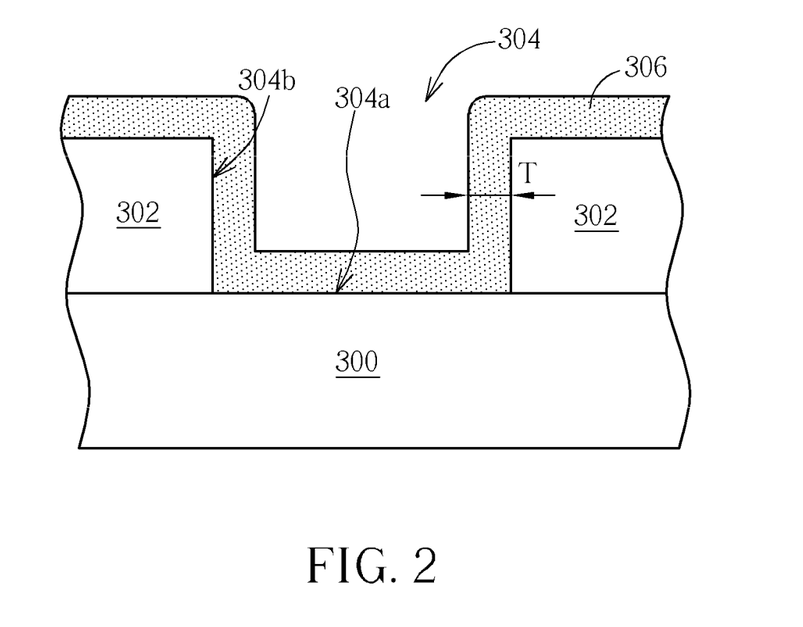

As shown in FIG. 2, a material layer 306 is formed all over the substrate 300. The material layer 306 is formed on a top surface of the first patterned mask layer 302 and conformally along the bottom surface 304a and the sidewalls 304b of the first trench 304. However, the material layer 306 does not completely fill the first trench 304. The method of forming the material layer 306 includes a chemical vapor deposition (CVD) process, such as an atomic layer deposition (ALD) process, but is not limited thereto. In one embodiment, the material layer 306 includes boron phosphor-silicate glass (BPSG) or APF. The material layer 306 has a thickness T substantially comprised between 10 nm (nanometer) and 200 nm.

Figure 3:
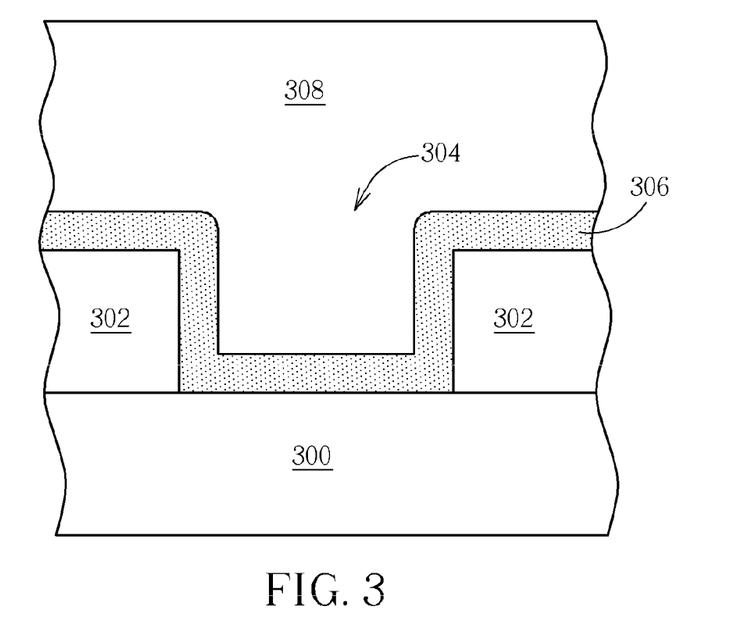

As shown in FIG. 3, a second mask layer 308 is formed on the substrate 300. The second mask layer 308 is formed on the material layer 306 and completely fills the first trench 304. The material of the second mask layer 308 can be the same or different from that of the first patterned mask layer 302. For example, the second mask layer 308 may include SiN, SiON, SiC or APF. Preferably, the second mask layer 308 has an etching selectivity with respect to the material layer 306. In another embodiment, the second mask layer 308 can include poly-silicon or organic materials such as spin-on-glass (SOG) or photo-resist.

Figure 4:
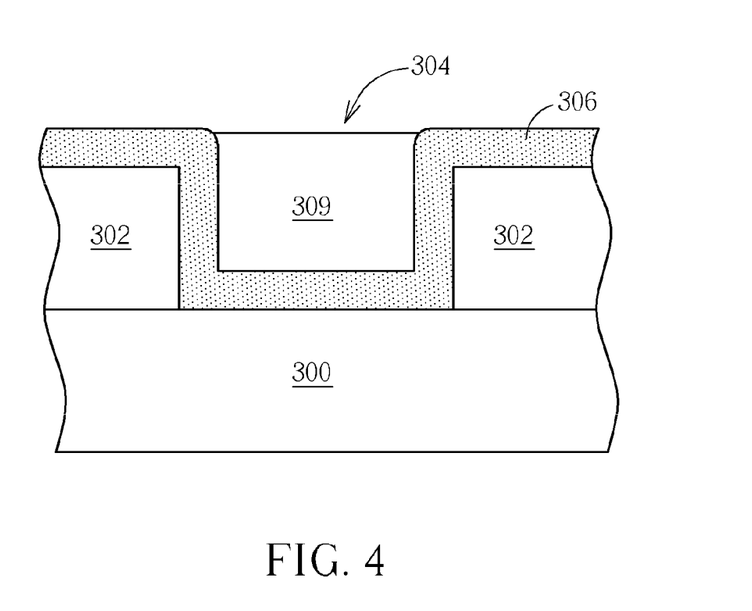

As shown in FIG. 4, a planarization process, such as an etching back process or a chemical mechanical polish (CMP) process or their combination, is performed to remove the second mask layer 308 outside of the first trench 304, thereby forming a second patterned mask layer 309 in the first trench 304. The planarization process is performed until the material layer 306 on the first patterned mask layer 302 is exposed. Preferably, the second patterned mask layer 309 is leveled with the material layer 306 on the first patterned mask layer 302. In one preferred embodiment, the planarization process is an etching back process. Since there is an etching selectivity between the second mask layer 308 and the material layer 306, the material layer 306 is not removed in this etching back process.

Figure 5:
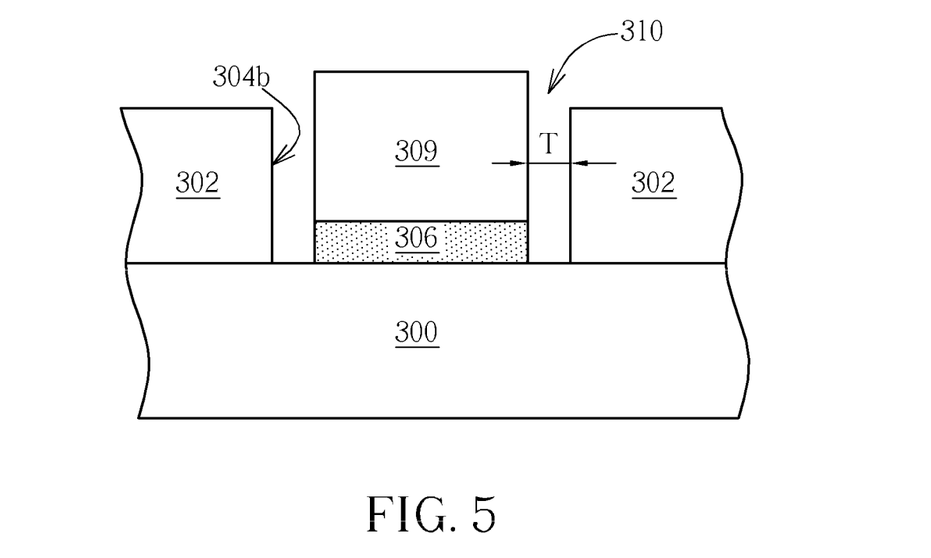

As shown in FIG. 5, a dry and/or wet etching process is performed to remove the material layer 306 on the sidewalls 304b of the first trench 304 and on the first patterned mask layer 302, while the portion of the material layer 306 between the substrate 300 and the second patterned mask layer 309 remains. In one preferred embodiment, a dry etching process is performed by using the first patterned mask layer 302 and the second patterned mask layer 309 as a mask to remove a portion of the material layer 306 so that the remaining material layer 306 aligns the above second patterned mask layer 309 along the vertical direction. This way, at least a second trench 310 is formed between the first patterned mask layer 302 and the second patterned mask layer 309, and the second trench 310 has a width substantially equal to the thickness T.

Figure 6:
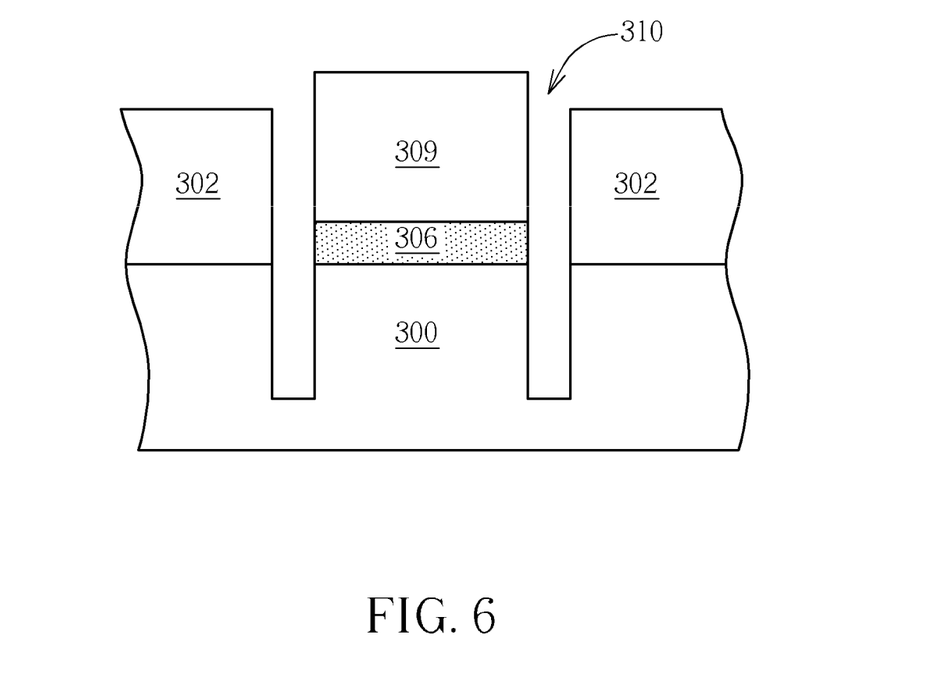
Figure 7:
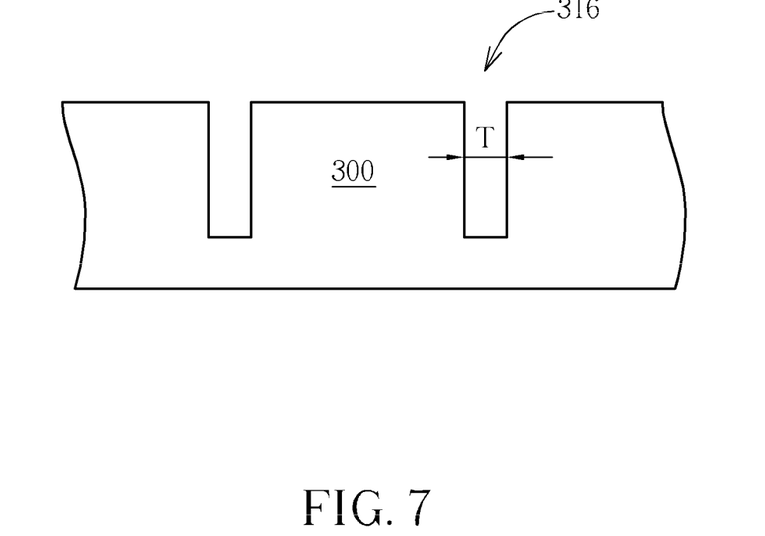

As shown in FIG. 6, a dry etching process is performed by using the first patterned mask layer 302 and the second patterned mask layer 309 as a mask to deepen the second trench 310 into the substrate 300. As shown in FIG. 7, the first patterned mask layer 302, the second patterned mask layer 309 and the material layer 306 are removed from the substrate 300. At least a third trench 316 is formed in the substrate 300 wherein the third trench 316 has a width equal to the thickness T of the material layer 306. By using the method shown in FIG. 1 to FIG. 7, an ultra-narrow trench can be formed in the substrate 300. In one embodiment, if the substrate 300 is a semiconductor substrate, the method set forth in the present invention can be applied to the STI formation processes, the Fin-FET or multigate-FET formation processes. In another embodiment, if the substrate 300 includes low-k dielectric layers, the third trench 316 can be utilized in forming the metal interconnection system such as the damascene processes, but is not limited thereto.

Figure 8:
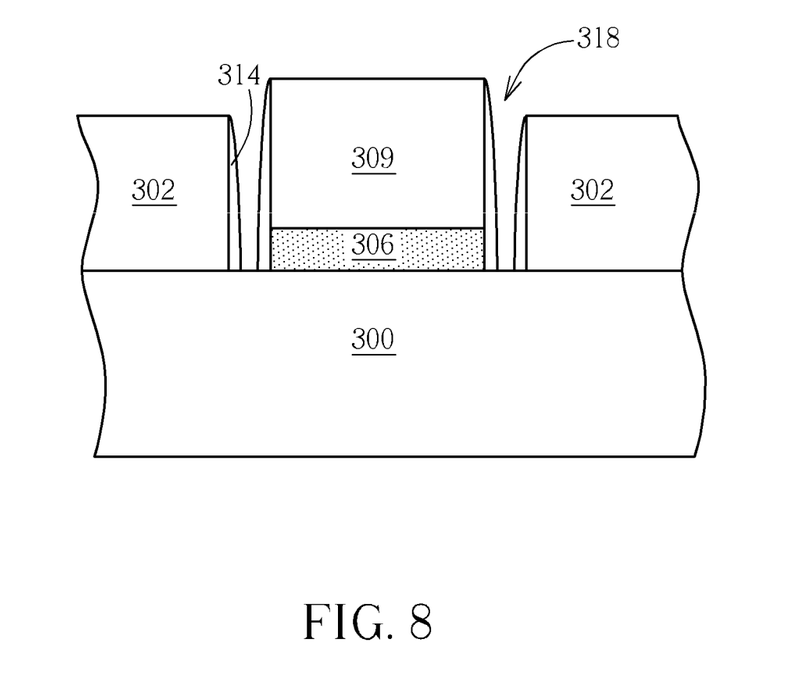
FIG. 8 is a schematic diagram of the method of forming a trench in a semiconductor substrate according to the second embodiment of the present invention.

Please refer to FIG. 8, which is a schematic diagram of the method of forming a trench in a semiconductor substrate according to a second embodiment of the present invention. As shown in FIG. 8, after processing the step in FIG. 5 described before, the width of the second trench 310 can further be reduced. For example, a second spacer 314 can be further formed on the sidewalls of the second trench 310, thereby forming the fourth trench 318. Subsequently, an etching process is performed to transfer the pattern of the fourth trench 318 to the substrate 300.

Figure 9:
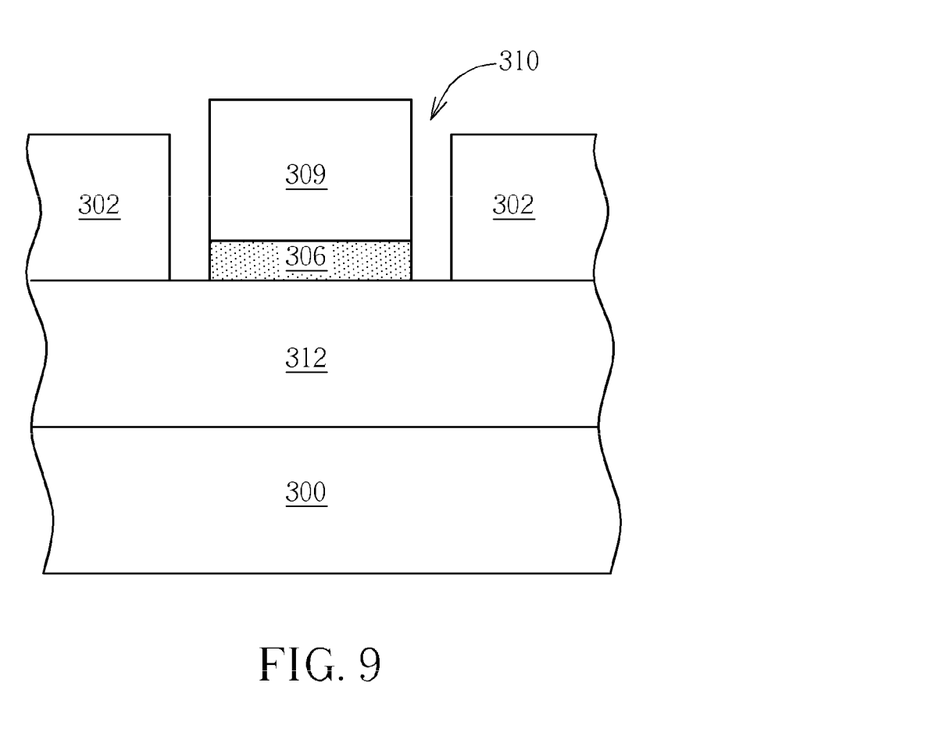
FIG. 9 to FIG. 10 are schematic diagrams of the method of forming a trench in a semiconductor substrate according to the third embodiment of the present invention.
Figure 10:
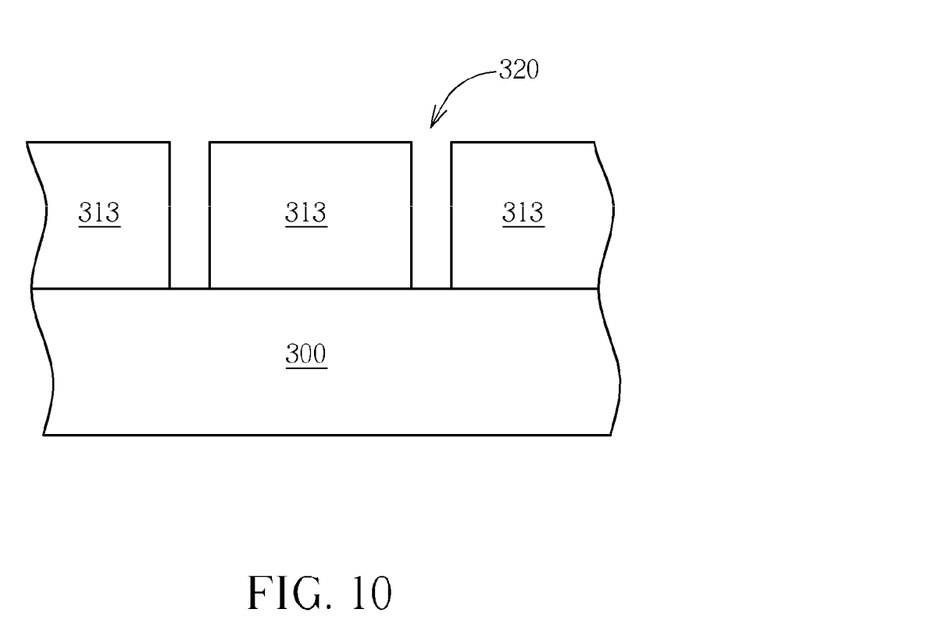

Please refer to FIG. 9 and FIG. 10, which are schematic diagrams of the method of forming a trench in a semiconductor substrate according to a third embodiment of the present invention. As shown in FIG. 9, a difference of the present embodiment from the first embodiment is that a third mask layer 312 can be formed on the substrate 300 before forming the first patterned mask layer 302. Then, as shown in FIG. 10, the pattern of the second patterned mask layer 309 is transferred to the third mask layer 312 to form the third patterned mask layer 313. As shown in FIG. 9, a dry etching process is performed by using the first patterned mask layer 302 and the second patterned mask layer 309 as masks in order to deepen the second trench 310 into the third mask layer 312 and form at least a fifth trench 320 into the third mask layer 312. Then, the first patterned mask layer 302, the second patterned mask layer 309 and the material layer 306 are removed. By using the third patterned mask layer 313 as a mask to perform a dry etching process, the third trench 316 in the substrate 300 as shown in FIG. 7 can be obtained.

The third patterned mask layer 313 can include any materials suitable for being a hard mask, such as SiN, SiON, SiC or APF. In another embodiment, the third patterned mask layer 313 may be a multi-layered structure having a phosphor-silicate glass (PSG) layer and a SiN layer disposed thereon, which is similar to the first patterned mask layer 302. When the third mask layer 312 is one single-layered structure, the third mask layer 312 preferably has an etching selectivity with respect to the first patterned mask layer 302 and to the second patterned mask layer 309. In one preferred embodiment, the third patterned mask layer 313 is APF, the first patterned mask layer 302 is SiN, the second patterned mask layer is photoresist, and the material layer 306 is BPSG. The present embodiment can also include the second embodiment, for example, including the step of forming a spacer on the sidewalls of the fifth trench 320 so as to form a narrower trench in the substrate 300.

Figure 11:
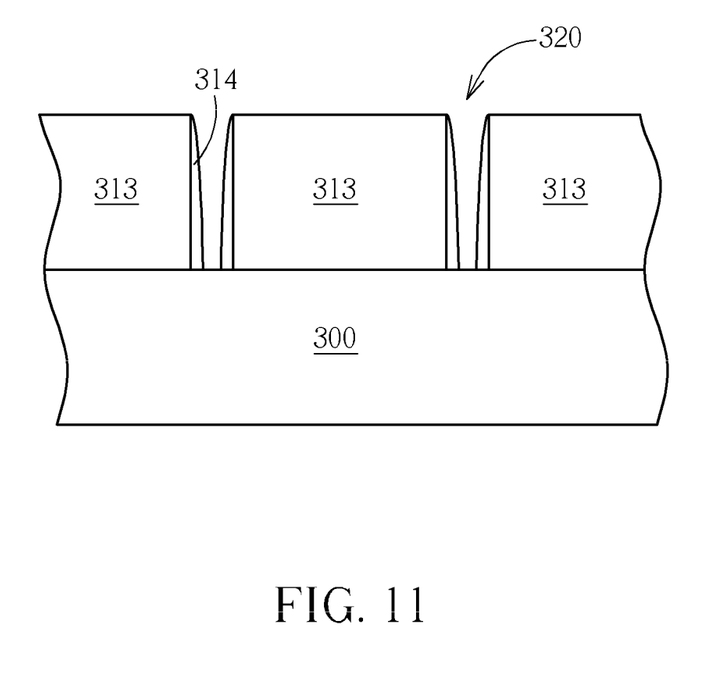
FIG. 11 to FIG. 12 are schematic diagrams of the method of forming a trench in a semiconductor substrate according to another embodiment of the present invention.
Figure 12:
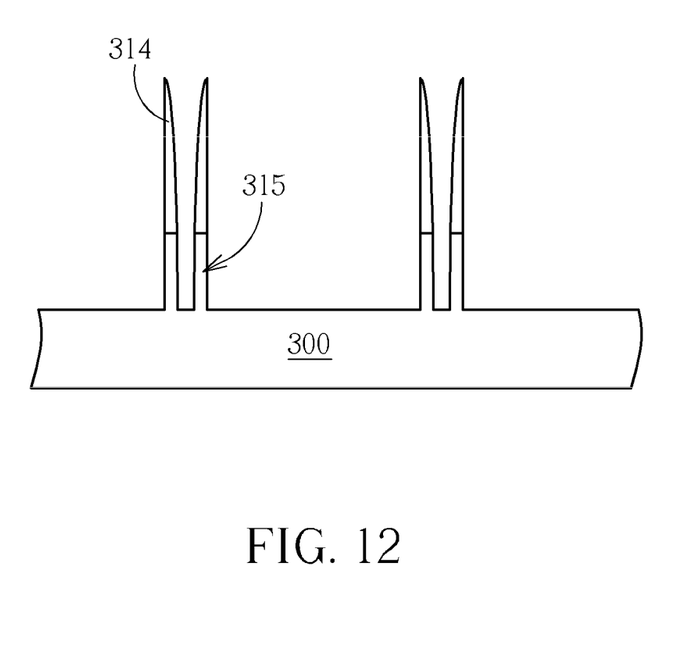

In addition, the present embodiment can be incorporated into the processes in the second embodiment. As shown in FIG. 11, by forming the second spacer 314 onside the fifth trench 320, a narrower trench can further be formed in the substrate 300. In still another embodiment, after the step in FIG. 11, the third patterned mask layer 313 can be removed while retaining the second spacer 314. Subsequently, the second spacer 314 is used as a mask to perform an etching process, thus removing a part of the substrate 300 and forming a plurality of ultra-narrow line patterns 315 in the substrate 300. The line pattern 315 can be used as the gate structure in a transistor or as the fin structure in a non-planar transistor.

Figure 13:
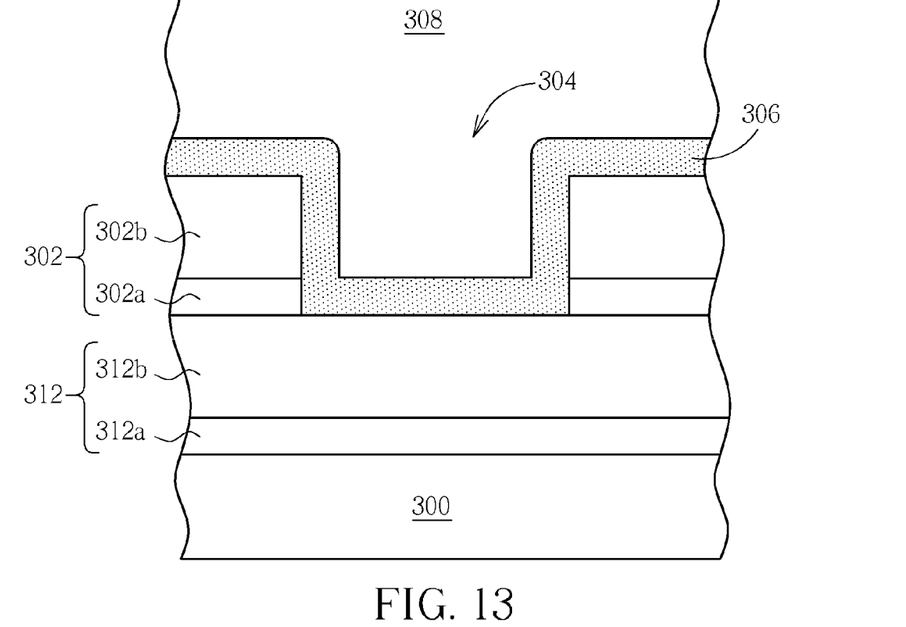
FIG. 13 to FIG. 17 are schematic diagrams of the method of forming a trench in a semiconductor substrate according to the fourth embodiment of the present invention.

Please refer to FIG. 13 to FIG. 17, which illustrate schematic diagrams of the method of forming a trench in a semiconductor substrate according to the fourth embodiment of the present invention. The feature in the fourth embodiment is that the mask layers are composed of more than one layer so as to upgrade the accuracy of the etching process. As shown in FIG. 13, the first patterned mask layer 302 includes a bottom first patterned mask layer 302a and a top first patterned mask layer 302b. The third mask layer 312 includes a bottom third mask layer 312a and a top third mask layer 312b. In one embodiment, the bottom first patterned mask layer 302a and the bottom third mask layer 312a have the same material, such as silicon oxide, and the top first patterned mask layer 302b and the top third mask layer 312b have the same material, such as silicon nitride. The second mask layer 308 includes photoresist or organic polymer. The material layer 306 includes BPSG for example.

Figure 14:
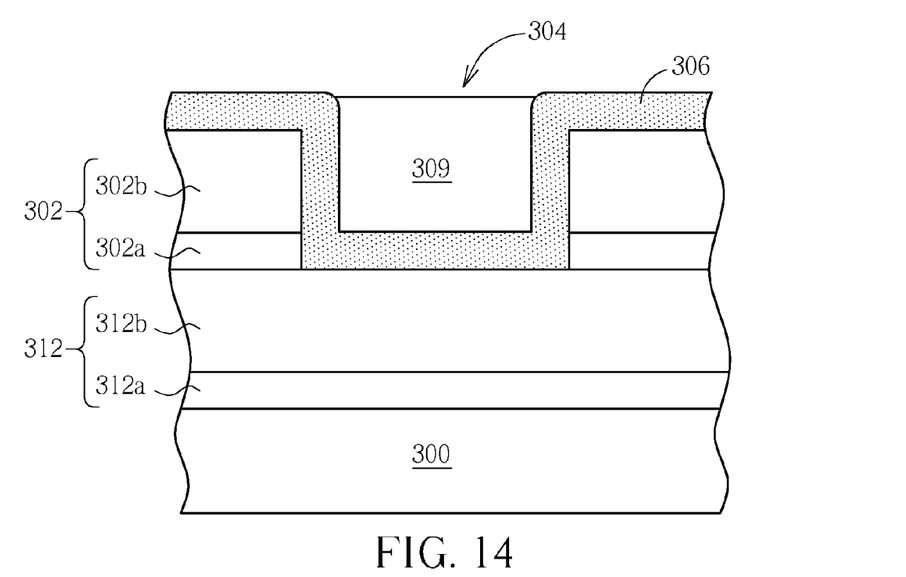

As shown in FIG. 14, a planarization process such as an etching back process is performed to remove the second mask layer 308 outside of the first trench 304, thereby forming a second patterned mask layer 309 in the first trench 304. Since there is an etching selectivity between the second mask layer 308 and the material layer 306, the etching process would not remove the material layer 306. In one embodiment, if the second mask layer 308 includes photoresist or organic polymer, the etching gas may include $CHF_3/O_2$.

Figure 15:
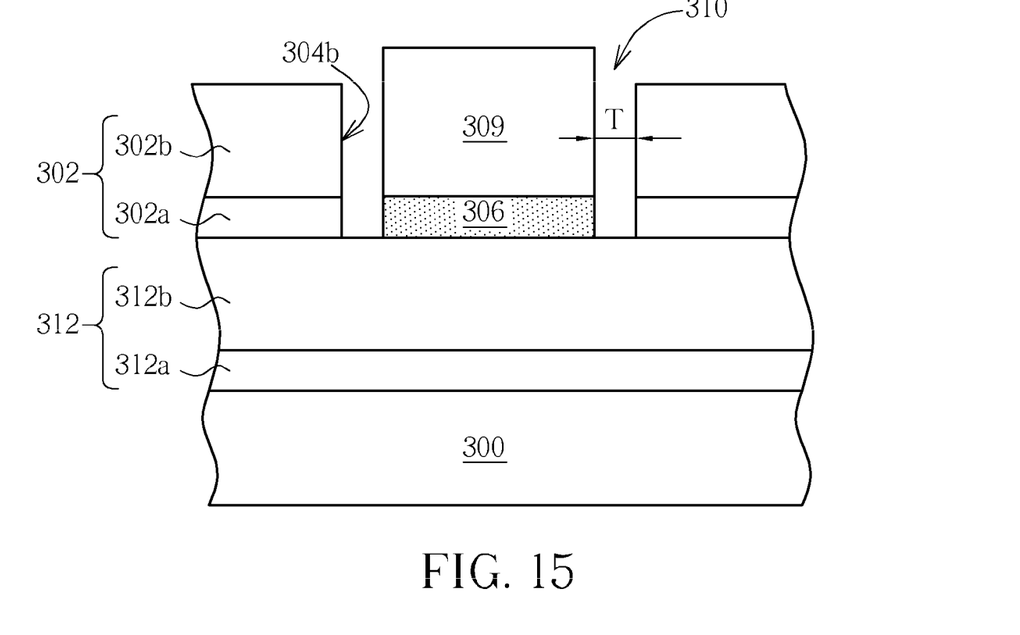

As shown in FIG. 15, a dry etching process is carried out by using the top first patterned mask layer 302b and the second patterned mask layer 309 as a mask to remove the material layer 306 on the sidewalls 304b of the first trench 304 and on the first patterned mask layer 302, while the portion of the material layer 306 between the substrate 300 and the second patterned mask layer 309 remains. In one embodiment, if the material layer 306 includes BPSG, the etching gas may include $CF_4/O_2$ or $C_4F_8/O_2$.

Figure 16:
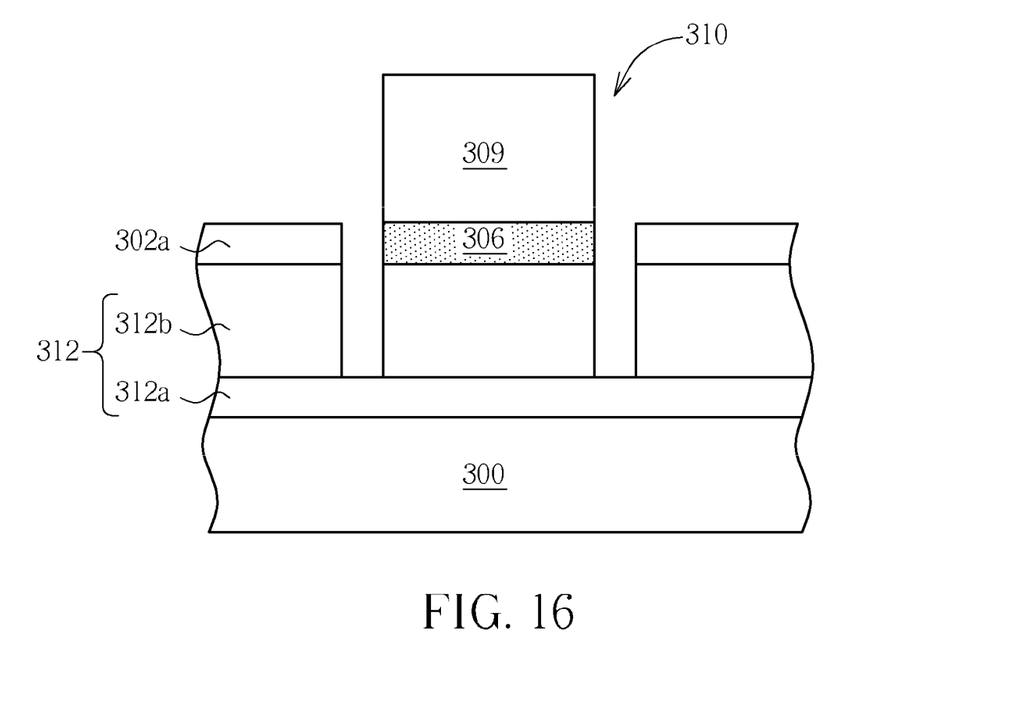

As shown in FIG. 16, a dry etching process is carried out by using the second patterned mask layer 309 as a mask to remove the top first patterned mask 302b and a part of the top third mask layer 312b. Since the top first patterned mask 302b and the top third mask layer 312b have the same material such as SiN, and the bottom first patterned mask 302a and the bottom third mask layer 312a have the same material such as $SiO_2$, the etching process uses the bottom first patterned mask 302a and the bottom third mask layer 312a as an etching stop layer. In one embodiment, the etching process can use etching gas including $CF_4/O_2$ or $C_4F_8/O_2$.

Figure 17:
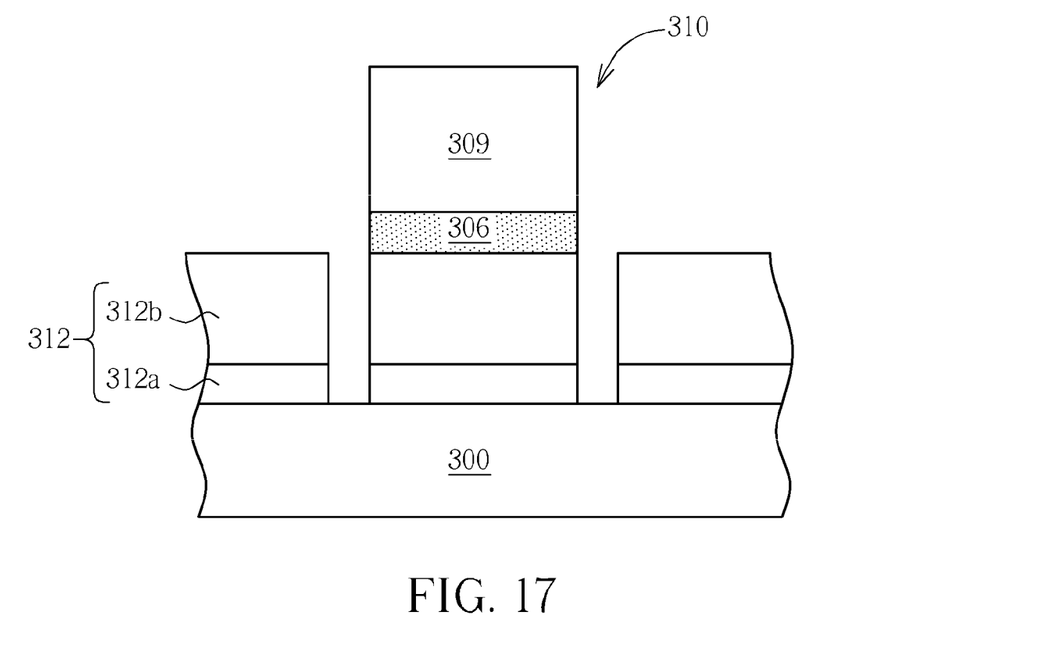

As shown in FIG. 17, a dry etching process is carried out by using the second patterned mask layer 309 as a mask to remove the bottom first patterned mask 302a and a part of the bottom third mask layer 312a. Since the bottom first patterned mask 302a and the bottom third mask layer 312a have the same material, the etching process would stop on the top third mask layer 312b and the substrate 300. In one embodiment, the etching process can use etching gas including $CH_3F/O_2$ or $CH_2F_2/O_2$.

Lastly, the trench structure as shown in FIG. 7 can be formed by using the top third mask layer 312b, the second patterned mask layer 309 as a mask to etch the substrate 300. In one embodiment, if the substrate 300 includes silicon, the etching process can use etching gas including $Cl_2/He$, $HBr/He$ or $Cl_2/HBr/He$. In the present embodiment, as the mask layer contains a multi-layered structure, the etching process can be performed more accurately because of the different etching selectivity in different layers. For example, the etching process can be performed by using the bottom first patterned mask layer 302a and bottom the third mask 312a as an etching stop layer. Similarly, the present embodiment can be incorporated into the previous embodiments.

Figure 18:
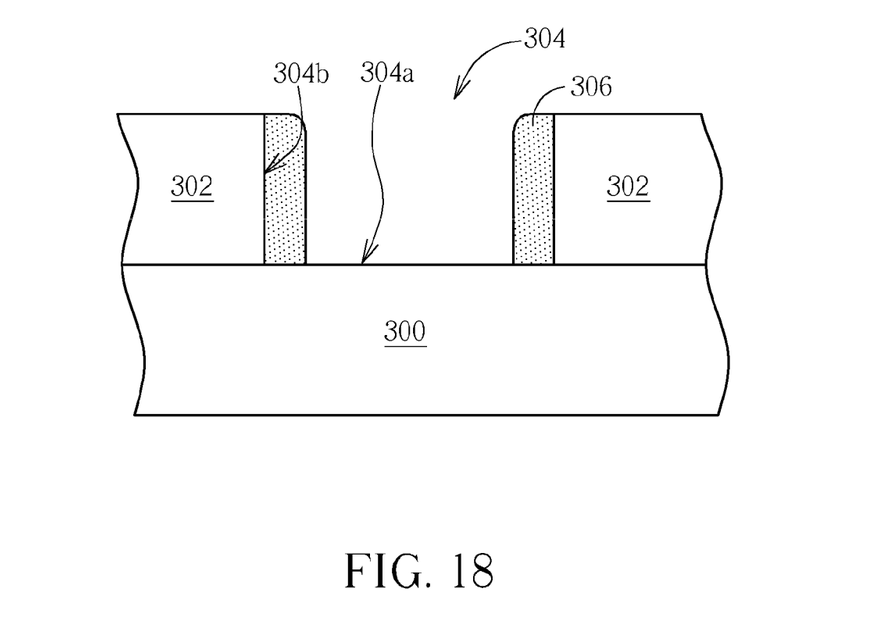
FIG. 18 to FIG. 20 are schematic diagrams of the method of forming a trench in a semiconductor substrate according to the fifth embodiment of the present invention.
Figure 19:
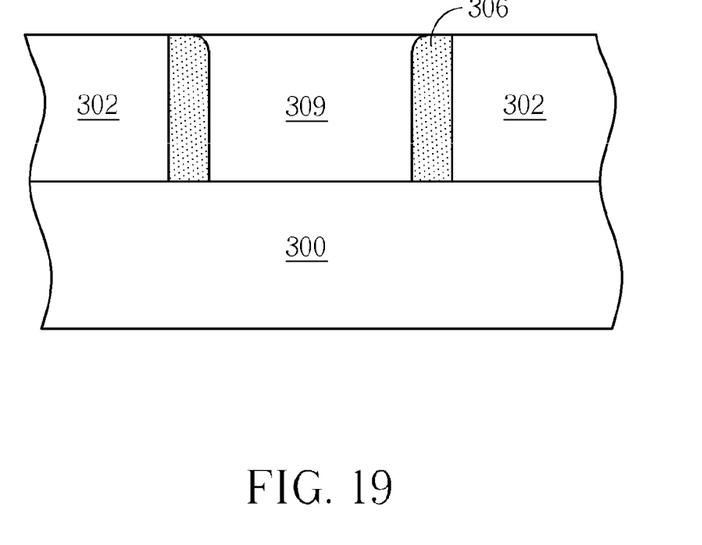
Figure 20:
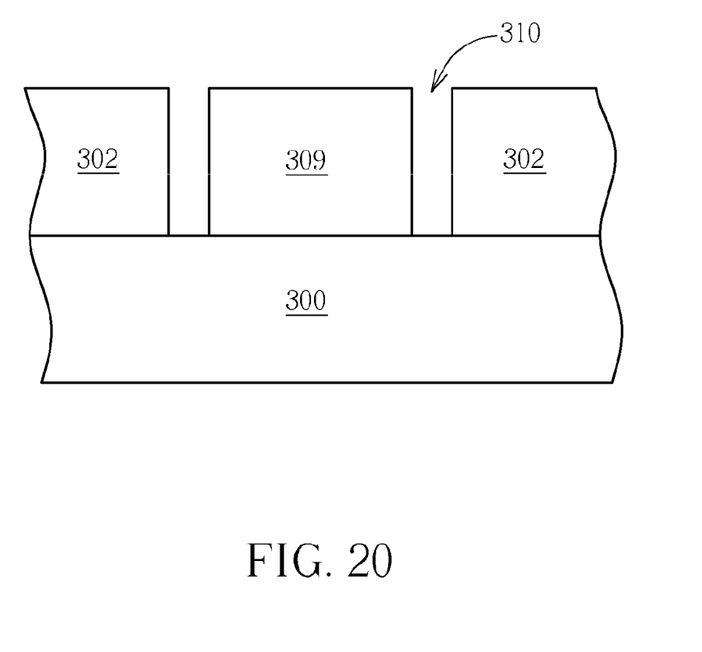

Please refer to FIG. 18 to FIG. 20, which illustrate schematic diagrams of the method of forming a trench in a semiconductor substrate according to the fifth embodiment of the present invention. The former steps in the present embodiment are similar to those in the first embodiment as shown in FIG. 1 and FIG. 2 and are not described repeatedly. After forming the material layer 306 as shown in FIG. 2, as shown in FIG. 18, a dry etching process is carried out to remove the material layer 306 on the first patterned mask layer 302 and the bottom surface 304a of the first trench 304. The portion of the material layer 306 on the sidewall 304b of the first trench 304 is maintained.

As shown in FIG. 19, a second patterned mask layer 309 is formed to at least completely fill the first trench 304. The method of forming the second patterned mask layer 309, for example, includes forming a second mask layer (not shown) comprehensively on the substrate 300 and then performing an etching back process to form the second patterned mask layer 309 in the first trench 304. In one embodiment, the second patterned mask layer 309 can be leveled with the first patterned mask layer 302 or a little lower than the first patterned mask layer 302. In principle, a top surface of the material layer 306 should be exposed.

As shown in FIG. 20, the material layer 306 on the substrate 300 is completely removed such that a second trench 310 is formed between the first patterned mask layer 302 and the second patterned mask layer 309 wherein the second trench 310 has a width equal to the thickness T of the material layer 306. Subsequently, as shown in the first embodiment, a dry etching process can be performed by using the first patterned mask layer 302 and the second patterned mask layer 309 as a mask to form the third trench 316 in the substrate 300. The present embodiment can incorporate the second embodiment, for example, to form a spacer on the sidewall of the second trench 310 so as to form a narrower trench in the substrate 300. In another embodiment, the present embodiment can incorporate the third embodiment. For example, a third mask layer 312 is formed before the first patterned mask layer 302 and then transferring the pattern of the second trench 310 to the third mask layer 312, following by transferring the pattern of the third patterned mask layer 313 into the substrate 300. In the subsequent steps, an ultra-narrow line pattern can be further formed by using the spacer as a mask.

It is noted that in the present embodiment, the first patterned mask layer 302 has an etching selectivity with respect to the material layer 306. In one embodiment, the third patterned mask layer 313 is APF, the first patterned mask layer 302 is SiN, the second patterned mask layer 309 is photoresist, and the material layer 306 is BPSG.

In summary, the method set forth by the present invention is to conformally form the material layer along the first trench, and then use the second mask layer to completely fill the first trench. The material layer on the sidewall of the first trench is then removed to form a second trench whose width is substantially equal to the thickness of the material layer. By using the method provided by the present invention, an ultra-narrow trench can be obtained in the semiconductor substrate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a trench in a substrate, comprising:
providing a substrate;

forming a first patterned mask layer on the substrate, wherein the first patterned mask layer has a first trench;

forming a material layer comprehensively on the substrate, wherein the material layer is formed on a bottom surface and at least a sidewall of the first trench;

forming a second mask layer on the material layer to completely fill the first trench;

completely removing the second mask layer outside the first trench to keep the second mask layer filled in the first trench to form a second patterned mask layer;

removing a portion of the material layer and maintaining the portion of the material layer between the second patterned mask layer and the substrate to form at least a second trench between the first patterned mask layer and the second patterned mask layer; and after forming the second trench, performing an etching process by using the first patterned mask layer and the second patterned mask layer as a mask.

2. The method of forming a trench in the substrate according to claim 1, wherein the etching process is to remove the substrate exposed by the second trench so as to form at least a third trench in the substrate.

3. The method of forming a trench in the substrate according to claim 1, after forming the second trench, further comprising:

forming at least a second spacer on a sidewall of the second trench to form a fourth trench in the second trench; and removing the substrate exposed by the fourth trench.

4. The method of forming a trench in the substrate according to claim 1, wherein the second patterned mask layer has an etching selectivity with respect to the material layer.

5. The method of forming a trench in the substrate according to claim 1, wherein before forming the first patterned mask layer, further comprising: forming a third mask layer on the substrate.

6. The method of forming a trench in the substrate according to claim 5, wherein the etching process is to remove the third mask layer exposed by the second trench to form a third patterned mask layer having a fifth trench.

7. The method of forming a trench in the substrate according to claim 6, after forming the third patterned mask layer, further comprising:

removing the substrate exposed by the fifth trench.

8. The method of forming a trench in the substrate according to claim 6, after forming the third patterned mask layer, further comprising:

forming at least a fifth spacer on a sidewall of the fifth trench to form a sixth trench in the fifth trench.

9. The method of forming a trench in the substrate according to claim 8, further comprising removing the substrate exposed by the sixth trench.

10. The method of forming a trench in the substrate according to claim 8, further comprising:

removing the third patterned mask layer; and etching the substrate by using the fifth spacer as a mask.

11. The method of forming a trench in the substrate according to claim 6, wherein the third patterned mask layer has an etching selectivity with respect to the first patterned mask layer and the second patterned mask layer.

12. The method of forming a trench in the substrate according to claim 1, wherein the first patterned mask layer and the second patterned mask layer comprise the same material.

* * * * *